United States Patent
Lee et al.

(10) Patent No.: US 12,542,519 B2
(45) Date of Patent: Feb. 3, 2026

(54) LOW NOISE AMPLIFIER

(71) Applicants: SKAIChips Co., Ltd., Suwon-si (KR); Research & Business Foundation SUNGKYUNKWAN UNIVERSITY, Suwon-si (KR)

(72) Inventors: Kang Yoon Lee, Seoul (KR); Behnam Samadpoor Rikan, Suwon-si (KR); Young Gun Pu, Suwon-si (KR); Jong Wan Jo, Suwon-si (KR)

(73) Assignees: SKAIChips Co., Ltd., Suwon-si (KR); Reseawrch & Business Foundation SUNGKYUNKWAN UNIVERSITY, Suwon-si (KR)

( * ) Notice: Subject to any disclaimer, the term of this patent is extended or adjusted under 35 U.S.C. 154(b) by 489 days.

(21) Appl. No.: 17/985,131

(22) Filed: Nov. 10, 2022

(65) Prior Publication Data
US 2023/0155557 A1 May 18, 2023

(30) Foreign Application Priority Data
Nov. 15, 2021 (KR) .................. 10-2021-0157074

(51) Int. Cl.
*H03F 3/193* (2006.01)
*H03F 1/26* (2006.01)
*H04B 1/16* (2006.01)

(52) U.S. Cl.
CPC .............. *H03F 3/193* (2013.01); *H03F 1/26* (2013.01); *H04B 1/16* (2013.01); *H03F 2200/294* (2013.01); *H03F 2200/451* (2013.01)

(58) Field of Classification Search
CPC . H03F 3/193; H03F 3/72; H03F 3/195; H03F 3/19; H03F 1/26; H03F 1/223; H03F 1/565; H03F 2200/294; H03F 2200/451; H03F 2200/156; H03F 2200/222; H03F 2200/387; H03F 2200/42; H03F 2200/48; H03F 2200/489; H03F 2200/492; H03F 2203/7233; H04B 1/16; H03G 3/3052; H03G 3/3036; H03G 2201/103
USPC ................ 330/278, 124 R, 295, 286, 84
See application file for complete search history.

(56) References Cited

U.S. PATENT DOCUMENTS 10,903,799 B2   1/2021 Yoo et al.
2019/0363680 A1* 11/2019 Yoo ........................ H03F 3/72

FOREIGN PATENT DOCUMENTS

KR   10-2019-0134360 A   12/2019

* cited by examiner

*Primary Examiner* — Andrea Lindgren Baltzell
*Assistant Examiner* — Nareh Shamiryan

(57) ABSTRACT

Disclosed is a technology related to a low noise amplifier applied between an RF receiver and an RF switch. A phase difference matching circuit having the same phase difference as a positive gain amplifier is added to an output terminal of an attenuator of a low noise amplifier having a variable gain switching structure. In addition, a variable impedance circuit connected to an output terminal of the positive gain amplifier and an output terminal of a phase difference matching unit to finely adjust the phase difference of each output terminal may be further included.

5 Claims, 2 Drawing Sheets

LOW NOISE AMPLIFIER

CROSS-REFERENCE TO RELATED APPLICATION

This application claims priority from Korean Patent Application No. 10-2021-0157074, filed on Nov. 15, 2021, in the Korean Intellectual Property Office, the disclosure of which is incorporated herein by reference in its entirety.

BACKGROUND

1. Field

The following description relates to a technology related to an RF circuit, particularly, to a technology related to a low noise amplifier.

2. Description of Related Art

A low noise amplifier is widely applied between an RF receiver and an RF switch. Today, in order to respond to an input signal with a wide range of power levels, a low noise amplifier has a variable gain switching structure that switches between a plurality of amplifier blocks having different gain values that vary from negative to positive values. In order to improve the performance of an RF receiver, it is a problem to keep a phase difference between the outputs of the plurality of amplifier blocks having different gain values sufficiently small. In particular, in order to solve a phase difference problem between an attenuator having a negative gain and implemented as a passive element and an amplifier having a positive gain, a method of controlling the delay of a software-sampled input signal according to a gain mode of a low noise amplifier in a receiver is usually applied. As a result, a signal connection between the low noise amplifier and the receiver is required, and it is cumbersome to design the receiver in consideration of the specifications of the low noise amplifier.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The proposed disclosure aims to reduce phase differences between outputs in a plurality of gain modes in a low noise amplifier.

Furthermore, the proposed disclosure aims to present a new structure of a low noise amplifier with improved phase difference between outputs in a plurality of gain modes.

Furthermore, the proposed disclosure further aims to substantially eliminate phase differences between outputs in a plurality of gain modes in a low noise amplifier.

According to one aspect of the proposed disclosure, a phase difference matching circuit having the same phase difference as a positive gain amplifier is added to an output terminal of an attenuator of a low noise amplifier having a variable gain switching structure.

According to an additional aspect, a variable impedance circuit connected to an output terminal of the positive gain amplifier and an output terminal of the phase difference matching unit to finely adjust the phase difference of each output terminal may be further included.

Figure 1:
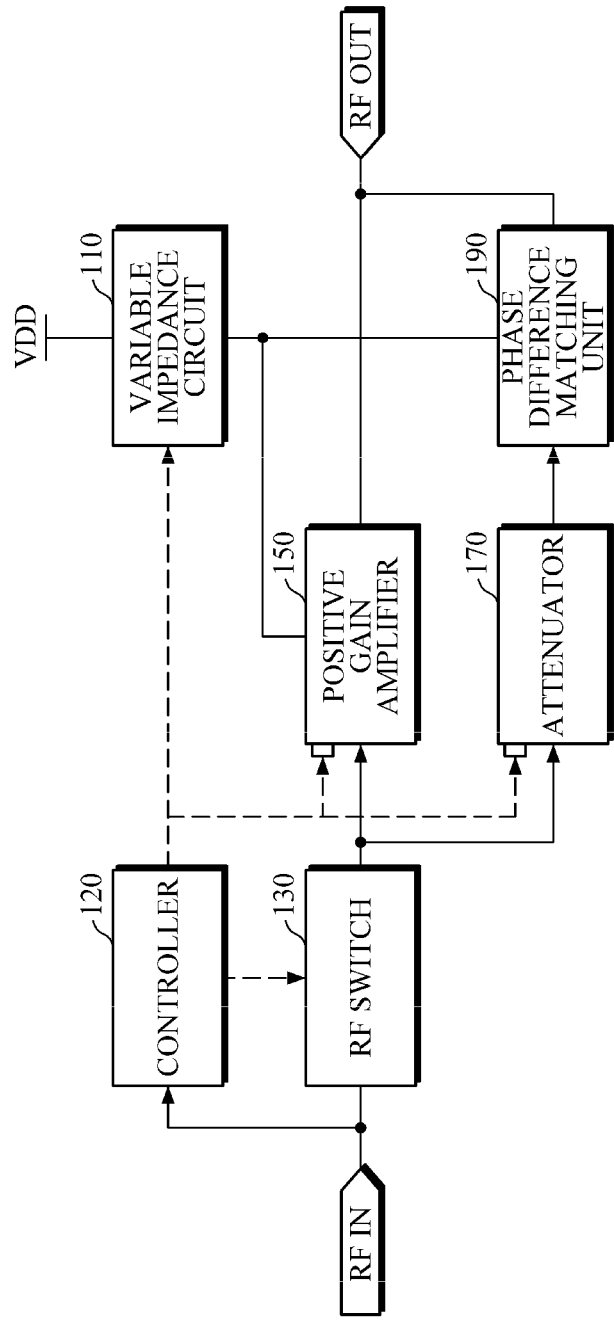
FIG. 1 is a block diagram illustrating a configuration of a low noise amplifier according to one exemplary embodiment.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The aforementioned and additional aspects are embodied through the exemplary embodiments described with reference to the accompanying drawings. It is understood that various combinations of the components of each exemplary embodiment are possible within one exemplary embodiment or with the components of other exemplary embodiments unless there is any other mention or mutual contradiction between them. Based on the principle that inventors can properly define the concept of terms to describe their own inventions in the best way, the terms used herein and in the claims should be interpreted as meanings and concepts consistent with the description or the proposed technical idea. Hereinafter, preferred exemplary embodiments of the present disclosure will be described in detail with reference to the accompanying drawings.

According to one aspect, a phase difference matching circuit having the same phase difference as a positive gain amplifier is added to an output terminal of an attenuator of a low noise amplifier having a variable gain switching structure. FIG. 1 is a block diagram illustrating a configuration of a low noise amplifier according to one exemplary embodiment. As illustrated, the low noise amplifier according to one exemplary embodiment includes a controller 120, an RF switch 130, a positive gain amplifier 150, an attenuator 170, and a phase difference matching unit 190.

The controller 120 detects a power level of an input RF signal and outputs a corresponding switching control signal. In one exemplary embodiment, the controller 120 is implemented as a microprocessor that detects a power level of an input signal and controls switching of an internal circuitry. However, it may be implemented as a logic circuit designed exclusively to perform a corresponding function or a circuit combining analog devices.

The RF switch 130 switches an input RF signal according to a switching control signal output from the controller 120. In one exemplary embodiment, the RF switch 130 may be implemented as a transistor connected between the positive gain amplifier 150 and an input terminal, and another transistor connected between the attenuator 170 and the input terminal. The switching control signal output from the controller 120 is applied to a gate of one transistor, and is inverted and input to a gate of the other transistor.

The positive gain amplifier 150 is connected to the RF switch to amplify an input RF signal and output the amplified RF signal. In one exemplary embodiment, the positive gain amplifier 150 is implemented as a common source amplifier. The positive gain amplifier 150 may be implemented as a variable gain amplifier including a structure in which a plurality of amplifiers each having different amounts of gains are connected in parallel. The controller 120 may achieve amplification with a variable gain by controlling the number of turned on or off transistors among the plurality of transistors.

The attenuator 170 is connected to the RF switch to attenuate an input RF signal and output the attenuated RF signal. In one exemplary embodiment, the attenuator 170 is implemented as a voltage divider. The attenuator 170 may be implemented as a variable attenuator including a structure in which a plurality of attenuators each having different attenuation rates and transistors that are connected to respective input terminals of the plurality of attenuators to regulate path connection are connected in parallel. A variable attenuation rate may be achieved by controlling to connect only one of the plurality of transistors. A common source amplifier constituting the positive gain amplifier outputs a signal having a phase difference of about 180 degrees from the input RF signal, whereas a voltage divider composed of resistors outputs a signal having the same phase difference as the input RF signal.

The phase difference matching unit 190 is connected to the output of the attenuator 170 and is implemented as a circuit having the same phase difference as the positive gain amplifier 150. In one exemplary embodiment, the phase difference matching unit may be implemented as a common source amplifier in the same manner as the positive gain amplifier 150. When parts of a circuit are implemented as the same circuit, it may have an advantage in terms of design convenience in designing a semiconductor device.

According to an additional aspect, a variable impedance circuit 110 connected to an output terminal of the positive gain amplifier and an output terminal of the phase difference matching unit to finely adjust the phase difference of each output terminal may be further included. In one exemplary embodiment, in the variable impedance circuit 110, a system supply voltage is connected to one end thereof and power input terminals of the positive gain amplifier 150 and the phase difference matching unit 190 is connected to the other end thereof. The impedance of both ends of the variable impedance circuit 110 is adjusted according to a phase difference fine adjustment instruction of the controller 120. In one exemplary embodiment, the variable impedance circuit has a structure in which a variable resistor, a variable capacitor, and a fixed inductor are connected in parallel. Since the structure of an on-chip variable resistor and an on-chip variable capacitor implemented in a semiconductor integrated circuit is known, a detailed description thereof will be omitted. The phase difference fine adjustment instruction of the controller may vary the impedance of both ends by regulating the connections of resistors and the connections of capacitors in the on-chip variable resistor and the on-chip variable capacitor. By adjusting the variable resistor, the gain value of the positive gain amplifier may be finely adjusted. In addition, by adjusting the variable capacitor, the phase difference may be finely adjusted.

In one exemplary embodiment, the positive gain amplifier 150 and the phase difference matching unit 190 may be equally implemented as a common source amplifier. In this case, the variable impedance circuit 110 having the aforementioned structure may be connected to a drain node of an output transistor of the common source amplifier. The variable impedance circuit may finely adjust the phase of an output signal by varying the impedance between power supply terminals and output terminals of the common source amplifiers.

In one exemplary embodiment, the controller 120 internally stores a phase difference fine adjustment value according to an operation mode so that an output of the low noise amplifier always has substantially the same phase value. The phase difference fine adjustment value may be determined by experimentation by composing an actual circuit when designing a low noise amplifier or may be determined by simulation based on a circuit design.

When the positive gain amplifier 150 includes a variable gain amplifier structure and/or when the attenuator 170 includes a variable attenuator, the controller 120 determines and outputs the phase difference fine adjustment instruction value to compensate for a minute phase difference appearing at the output terminal according to the variable gain or the variable attenuation rate as well as the RF switch 130.

Figure 2:
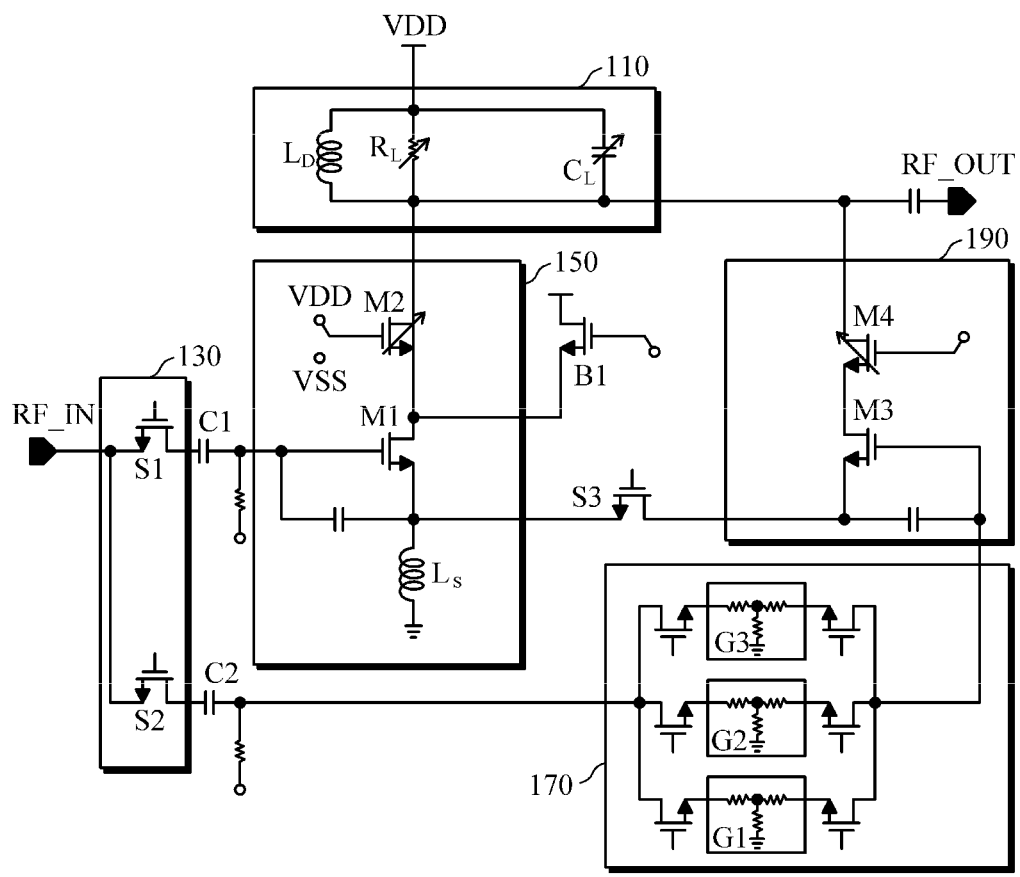
FIG. 2 is a circuit diagram illustrating the configuration of the low noise amplifier according to one exemplary embodiment.

FIG. 2 is a circuit diagram illustrating the configuration of the low noise amplifier according to one exemplary embodiment. This circuit diagram is illustrated to help logical understanding of a circuit implemented as an integrated circuit, and does not accurately represent all elements without omission. A controller is implemented as a microprocessor core, and is omitted from the drawing.

The low noise amplifier according to the illustrated exemplary embodiment includes an RF switch 130, a positive gain amplifier 150, an attenuator 170, and a phase difference matching unit 190. In the illustrated exemplary embodiment, the RF switch 130 is implemented as a transistor connected between the positive gain amplifier 150 and an RF input terminal RF_IN, and another transistor connected between the attenuator 170 and the input terminal. A switching control signal output from the controller is applied to gates of these transistors, respectively.

The positive gain amplifier 150 is connected to the RF switch to amplify an input RF signal and output the amplified RF signal. In one exemplary embodiment, the positive gain amplifier 150 is implemented as a common source amplifier. In the drawing, a transistor M2 is illustrated as a single transistor, but in reality, it may be implemented as a variable gain amplifier including a structure in which a plurality of transistors are connected in parallel to implement a variable gain. Amplification with variable gains may be achieved by controlling the number of transistors turned on or off among the plurality of transistors by the controller. A switch marked on a gate of the transistor M2 represents this control. The operation of the positive gain amplifier 150 may be turned on/off by controlling the voltage applied to a gate of a transistor B1.

In the illustrated exemplary embodiment, the attenuator 170 is implemented as a variable attenuator having a structure in which branches composed of a plurality of attenuators each having a different attenuation rate and transistors connected to an input terminal and an output terminal of each attenuator are connected in parallel. The controller 120 may achieve a variable attenuation rate by controlling only one of the plurality of branches to be connected. The common source amplifier constituting the positive gain amplifier outputs a signal having a phase difference of about 180 degrees from the input RF signal, whereas a voltage divider composed of resistors outputs a signal having the same phase difference as the input RF signal.

The phase difference matching unit 190 is connected to the output of the attenuator 170, and may be implemented as a common source amplifier in the same manner as the positive gain amplifier 150. By implementing the output terminal of the attenuator 170 as the same circuit as the positive gain amplifier 150, the phase difference between two paths may be minimized.

According to an additional aspect, the low noise amplifier according to the illustrated exemplary embodiment includes a variable impedance circuit 110. In the illustrated exemplary embodiment, in the variable impedance circuit 110, one end is connected to a system supply voltage VDD and the other end is connected to power input terminals of the positive gain amplifier 150 and the phase difference matching unit 190. The impedance of both ends of the variable impedance circuit 110 is adjusted according to a phase difference fine adjustment instruction of the controller 120. In one exemplary embodiment, a variable impedance circuit has a structure in which a variable resistor $R_L$, a variable capacitor $C_L$, and a fixed inductor are connected in parallel. The gain value of the positive gain amplifier may be finely adjusted by adjusting the variable resistor. In addition, the phase difference may be finely adjusted by adjusting the variable capacitor $C_L$.

In the illustrated exemplary embodiment, the controller detects a power level of the input RF signal. When a low power signal is input and amplification is required, the controller turns on a transistor S1 and turns off a transistor S2 in the RF switch 130. In addition, an appropriate variable gain value is achieved by turning on or off the array transistors M2 of the positive gain amplifier 150 to correspond to a required gain. In this case, the operation of the phase difference matching unit 190 may be excluded by turning off both a switch S3 and array transistors M4 of the phase difference matching unit 190. However, the gain value may be finely adjusted by adjusting the variable resistor $R_L$ of the variable impedance circuit 110. In addition, the phase difference may be finely adjusted by adjusting the variable capacitor $C_L$.

Meanwhile, when a high power signal is input and attenuation is required, the controller turns off the transistor S1 and turns on the transistor S2 in the RF switch 130. In addition, a selected one of transistor pairs at both ends of the voltage divider of the attenuator 170 is turned on and the other is turned off to achieve an appropriate attenuation value to correspond to a required attenuation value. In this case, in the phase difference matching unit 190, the controller outputs an adjustment control value corresponding to a selected attenuation value to control the occurrence of a predetermined phase difference between the input/output RF signals. In addition, a gain value may be finely adjusted by adjusting the variable resistor $R_L$ of the variable impedance circuit 110, and a phase difference may be finely adjusted by adjusting the variable capacitor $C_L$ of the variable impedance circuit 110.

According to the proposed disclosure, output RF signals remain the same phase difference regardless of operation modes in a low noise amplifier. Accordingly, there is no need to consider a phase difference in designing a receiver connected to the low noise amplifier or controlling an operation.

Although the present disclosure has been described above with reference to the accompanying drawings, the present disclosure is not limited thereto, and it should be construed to encompass various modifications that may be apparently derived by those skilled in the art. The scope of the claims is intended to cover these modifications.

What is claimed is:

1. A low noise amplifier, comprising:
   a controller configured to detect a power level of an input RF signal and output a corresponding switching control signal;
   an RF switch configured to switch the input RF signal according to the switching control signal;
   a positive gain amplifier connected to the RF switch and configured to amplify the input RF signal and output the amplified RF signal;
   an attenuator connected to the RF switch and configured to attenuate the input RF signal and output the attenuated RF signal; and
   a phase difference matching unit connected to an output of the attenuator and implemented as a circuit having the same phase difference as the positive gain amplifier,
   wherein both the phase difference matching unit and the positive gain amplifier include a common source amplifier that generates a 180 degree phase difference.

2. The low noise amplifier of claim 1, wherein the positive gain amplifier includes a variable gain amplifier.

3. The low noise amplifier of claim 1, wherein the attenuator includes a variable attenuator.

4. The low noise amplifier of claim 1, further comprising a variable impedance circuit in which a system supply voltage is connected to one end and another end is connected to power input terminals of the positive gain amplifier and the phase difference matching unit, and the impedance of both ends is adjusted according to a phase difference fine adjustment instruction of the controller.

5. The low noise amplifier of claim 1, further comprising a variable impedance circuit in which a system supply voltage is connected to one end and another end is connected to drain nodes of output transistors of a common source amplifier of the positive gain amplifier and a common source amplifier of the phase difference matching unit, and the impedance of both ends is adjusted according to a phase difference fine adjustment instruction of the controller.

* * * * *